May 5, 1970 D. J. BAKER 3,510,808

TUNER BAND SWITCHING ARRANGEMENT

Filed Dec. 26, 1967 2 Sheets-Sheet 1

INVENTOR.
Donald J. Baker
BY
Edward J. Coleman
AGENT.

May 5, 1970 D. J. BAKER 3,510,808

TUNER BAND SWITCHING ARRANGEMENT

Filed Dec. 26, 1967 2 Sheets-Sheet 2

INVENTOR.
Donald J. Baker
BY
Edward J. Coleman
AGENT.

United States Patent Office 3,510,808
Patented May 5, 1970

3,510,808
TUNER BAND SWITCHING ARRANGEMENT

Donald J. Baker, Williamsville, N.Y., assignor to Sylvania Electric Products Inc., a corporation of Delaware Filed Dec. 26, 1967, Ser. No. 693,607
Int. Cl. H03j 1/08, 5/30
U.S. Cl. 334—49 2 Claims

ABSTRACT OF THE DISCLOSURE

A radio frequency tuner band switching mechanism comprising a linear coplanar train of molded plastic spur gears upon which tunable coils are mounted. The gear train is arranged to lie in a plane parallel to and juxtaposed with a printed circuit board containing a plurality of cascaded tuned circuits. Selective interconnection of the gear mounted coils and the printed circuitry is provided through engagement of switch contacts on each gear with resilient bellows contacts attached to the printed circuit board. A drive shaft attached to one of the gears enables actuation of the gear train to simultaneously switch a selected set of coils into the string of tuned circuits to accommodate a selected frequency band.

BACKGROUND OF THE INVENTION

This invention relates generally to switching mechanisms for electrical circuits, and in particular to an improved band switching arrangement for multistage radio frequency tuners.

The band switching function for which the present invention is particularly adapted is that whereby a radio frequency tuned circuit is coarse tuned to cover a different frequency band by mechanically switching a different inductor, or set of inductors, into the circuit. Hence, to provide the capability of covering $n$ bands in a tuner comprising $m$ tuned circuit stages, $n \times m$ different inductor coils are required.

The conventional method of accomplishing band switching is to employ a rotatable disc upon which coils for a given tuned circuit stage are mounted in a symmetrical radial arrangement, or a turret like axial arrangement. Appropriate terminal contacts are provided to enable the coils to be successively switched into and out of the circuit as the disc is rotated. In a multistage tuner, a plurality of rotating discs corresponding to the number of tuned circuits are stacked on a shaft with sufficient spacing between members to allow for wiring interconnections and the mounting of radio frequency shields between stages. An alternative approach often used in VHF television receivers comprises the use of a turret tuner having longitudinal resonant circuit strips corresponding to each of the VHF channels. To change channels, the turret arrangement is rotated to switch the appropriate circuit strip into the tuner radio frequency circuit stages.

In light of the recent advancements in electronic circuit packaging achieved through the use of strip transmission line, other printed circuit techniques, transistors, integrated circuits, etc., such tuner configurations are quite bulky and inflexible and severely limit the full realization of the advantages of compactness and lightweight for applications such as avionics. Further, many of the conventional tuner designs result in lead lengths which are much longer than desired for efficient VHF and UHF circuit design. A number of the previous band switching arrangements also make adjustment of the coil tuning slugs rather awkward and present substantial radio frequency shielding problems.

SUMMARY OF THE INVENTION

The present invention overcomes the aforementioned disadvantages of the prior art by providing a tuner band switching mechanism which comprises a linear, coplanar train of molded plastic spur gears upon which tunable coils are mounted. This band switching arrangement is particularly well adapted for use in combination with a string of tuned circuit stages mounted on a printed circuit board. The gear train is rotatably mounted on the printed circuit board to lie in a plane parallel to and juxtaposed with the circuit board, thereby providing an extremely compact package. The inductors on each gear are connected to respective sets of switch contacts disposed symmetrically about the gear axis on the side of gear facing the printed circuit board. Associated with each gear is a set of resilient bellows contacts which are connected to one of the tuned circuits mounted on the printed circuit board and disposed on the side of the board facing the gear train. Each set of bellows contacts is arranged in a pattern corresponding with the pattern of each set of switch contacts on the gear with which it is associated. Consequently, rotation of the gear enables selective engagement of any one of the sets of switch contacts on the gear with the associated set of bellows contacts, thus switching a selected inductor into a tuned circuit. In this manner, short low inductance conducting paths are provided in the interconnection between the switched inductors and the board mounted tuned circuits. A tuner drive shaft may be attached to any one of the gears to enable actuating the entire gear train and thus simultaneously band switching of the entire string of tuned circuit stages to accommodate a selected frequency band.

The gear train switching arrangement provides a flexible design capable of being arranged in various configurations to suit given applications. Further, the approach is conveniently adaptable to the use of coils, contacts, and circuit wiring produced by printed circuit techniques. By placing all non-switched components on a single printed circuit board, separate circuit card mountings and intercompartment hand wiring is eliminated, thereby contributing significantly to reproducibility and operational stability. The parallel plane configuration of the band switching mechanism with the printed circuit strip, along with the adaptability for unidirectional orientation of the tunable inductors, provides a modern circuit packaging technique that enhances serviceability. The basic mechanical configuration can also be used for high density switching of diode matrices and other components capable of being mounted using printed circuit techniques.

BRIEF DESCRIPTION OF THE DRAWINGS

This invention will be more fully described hereinafter in conjunction with the accompanying drawings in which.

DETAILED DESCRIPTION OF THE INVENTION

The invention will now be described in a preferred embodiment as implemented in a VHF radio frequency tuner including a cascaded string of four tuned circuits mounted on a single printed circuit board. The circuitry may comprise, for example, a double tuned antenna input coupling circuit followed by a pair of cascaded transistorized amplifiers. Hence, assuming band switching of inductors is employed to accomplish the coarse tuning function, a set of four inductors must be switched into the string of tuned circuits to accommodate a selected frequency band.

Figure 1:
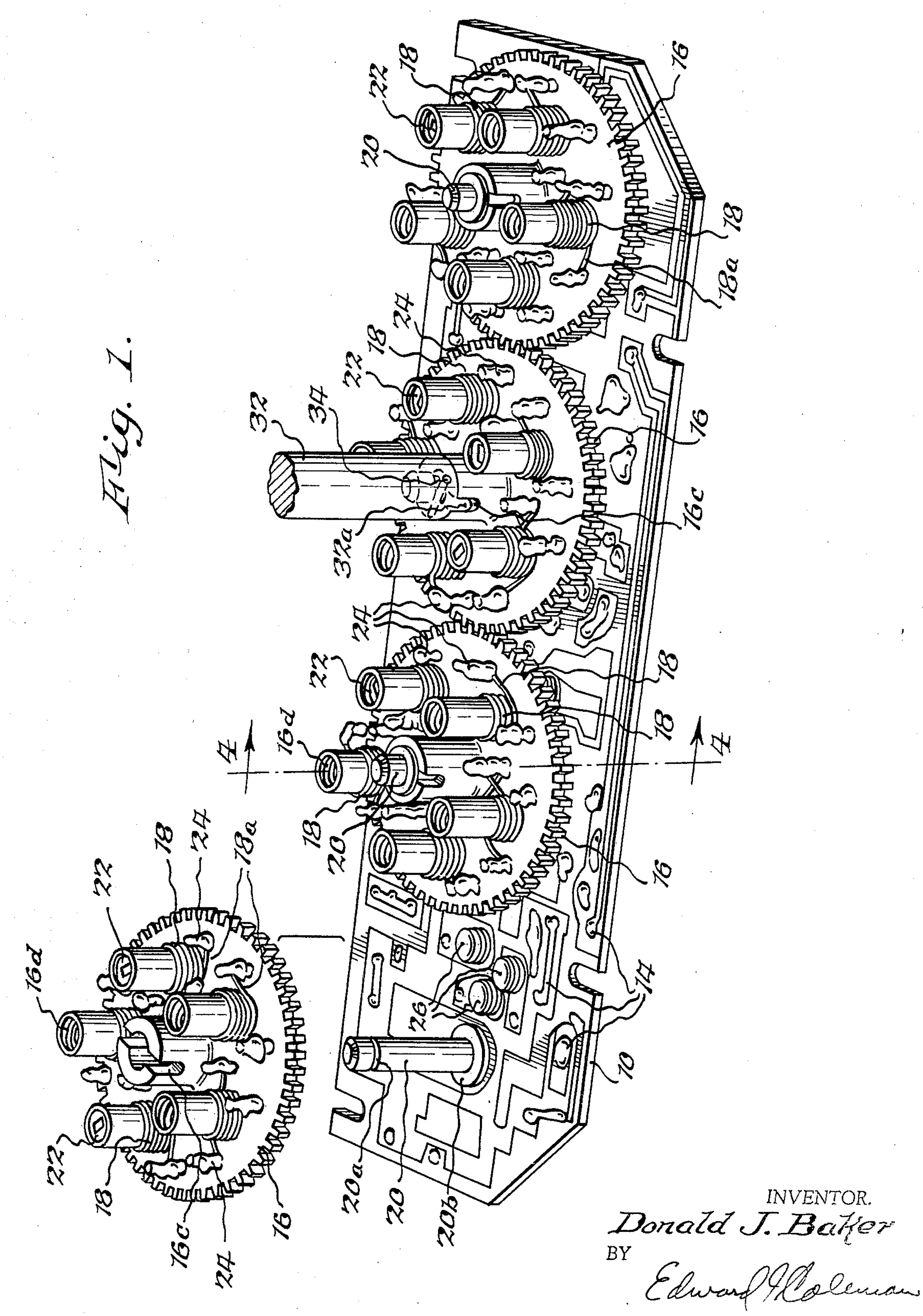
FIG. 1 is a perspective view of a tuner band switching mechanism according to a preferred embodiment of the invention, in combination with a printed circuit board, one of the gears of the mechanism being detached from and illustrated above the printed circuit board.
Figure 2:
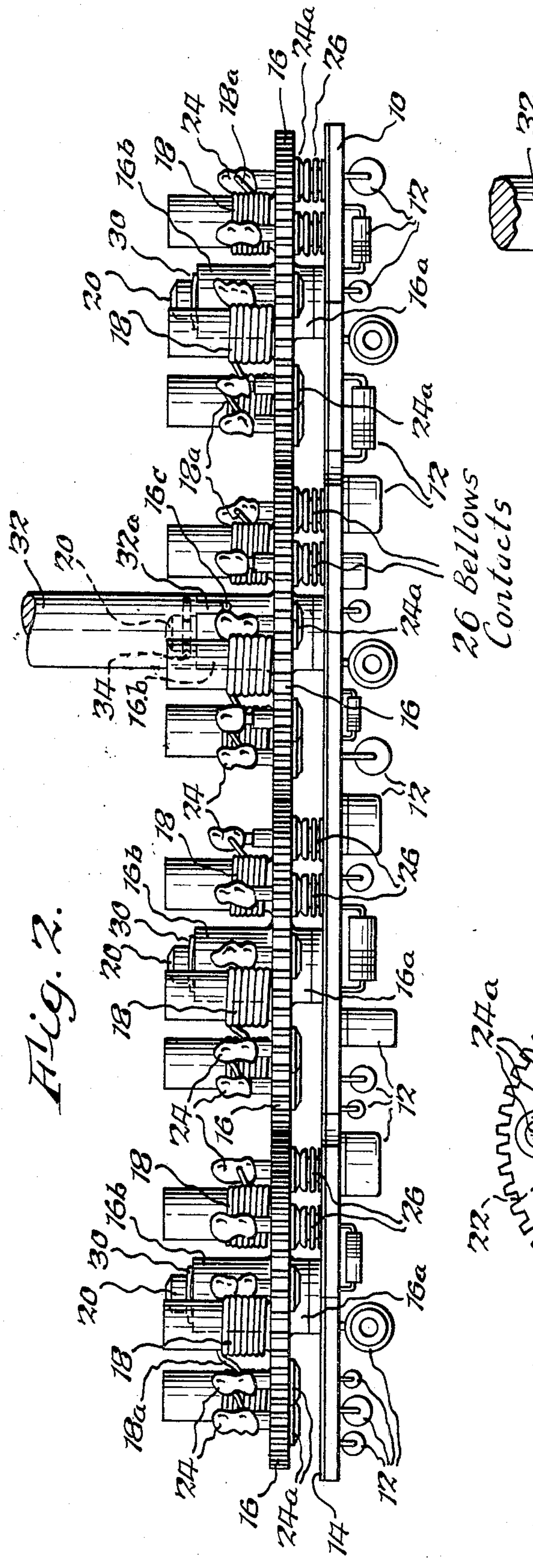
FIG. 2 is a side view of the switching mechanism and printed circuit board combination of FIG. 1.

Referring to FIGS. 1 and 2 there is shown a printed circuit board 10 having a plurality of components mounted on the bottom side thereof and represented, generally, by the reference character 12. These components are functionally interconnected in the usual manner by passing their leads through small holes in board 10 and appropriately soldering them to an etched conductor pattern 14 on the top side of printed circuit board. The associated band switching mechanism comprises a linear coplanar train of intermeshing spur gears 16 upon which tunable coil inductors 18 are mounted. In this instance, five coil inductors 18 are mounted on each gear 16 to enable selection of five different frequency bands, and four gears 16 are employed in the train to provide simultaneous band switching of the four tuned circuits. Each gear 16 is rotatably mounted on a respective one of four metal shafts 20 fixedly secured to printed circuit board 10 and extending perpendicular therefrom to provide axes for the respective gears. As best illustrated in FIG. 2, this mounting arrangement provides a very compact package in which the gear train lies in a plane parallel to and juxtaposed with the printed circuit board.

Each gear 16 is composed of a dielectric material and, preferably, is a molded plastic piece; one of the classes of material found suitable for this purpose is Delrin 500 Series available from E. I. du Pont Company. The five coil inductors 18 on each gear are disposed symmetrically about the gear axis and oriented with the coil axis perpendicular to the plane of the gear. With this arrangement, all the coils face in one direction to provide convenient access to their tuning slugs 22 from one side of the tuner assembly for individual coil adjustment purposes. Of course, if a flatter configuration is desired, the coils may be mounted radially on each gear.

Figure 3:
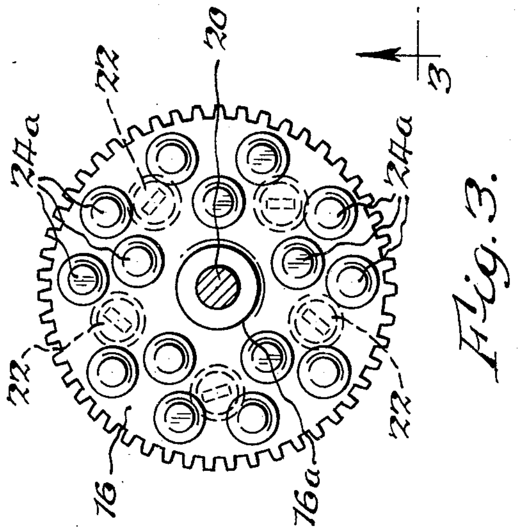
FIG. 3 is a horizontal section taken on the line 3—3 of FIG. 4 which illustrates the arrangement of the sets of contacts with respect to one of the gears of the mechanism.

In this instance, each of the coils 18 has three leads **18*a* which are respectively connected to a set of three terminal posts 24 associated with that coil. Each terminal post extends through the gear to which it is attached to form a switch contact 24*a* on the bottom side of that gear facing the printed circuit board. As illustrated in the bottom view of a gear in FIG. 3, the terminal posts attached to each gear are arranged so as to form five sets of three switch contacts each arranged in identical patterns and disposed symmetrically about the gear axis on the side of the gear facing the printed circuit board. Interconnections to each of the tuned circuits on board 10 are made through a set of three resilient bellows contacts associated with each gear 16. The bellows contacts 26 are soldered to appropriate traces on the top side of printed circuit board 10 facing the gear train and each of the four sets of bellows 26 is arranged under its associated gear in a pattern corresponding with the pattern of each set of switch contacts 24*a* on that gear. In this manner, by rotating the gear 16, each set of three switch contacts 24*a* can be successively brought into register with the three board mounted resilient bellows contacts 26. Further, the spacing between the train of gears 16 and printed circuit board 10 is established such that as the gears are rotated, the switch contacts will wipe across the resilient bellows contacts making a good electrical connection therebetween. Thus, rotation of gear 16 is operative to effect selective engagement between one of its sets of switch contacts 24*a* and the associated set of bellows contacts 26, such that the three terminals 24** of the selected coil will be interconnected through the bellows to the associated tuned circuit. In this manner, short, low inductance, conductor paths are provided between the coils and the printed circuit stages.

The height of the bellows, spacing between gear and board, and force exerted upon compression of the bellows are designed not only to provide a sufficient electrical contact between the bellows and switch contacts, but also to restrict the friction drag upon the gear to a minimum. Miniaturized bellows contacts of this type are available from sources such as the Servometer Corporation of Clifton, N.J., the Kinemotive Corporation of Farmingdale, N.Y., and the Metal Bellows Corporation of Sharon, Mass.

Figure 4:
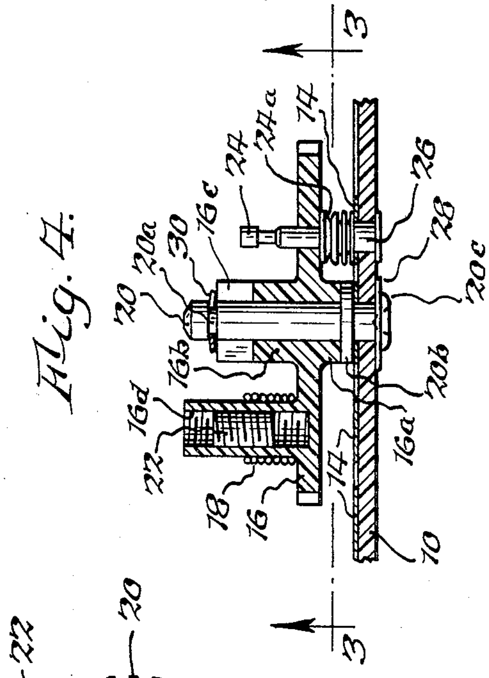
FIG. 4 is a vertical section taken along the line 4—4 of FIG. 1, with a bellows contact inserted under the terminal post for clarity; and, FIG. 5 is an exploded perspective view of a drive shaft coupling method useful in implementing the switching mechanism of FIG. 1.

A preferred method of mounting the gear and components thereon is shown in FIG. 4, which is a cross section view taken along the line 4—4 of FIG. 1 (with a bellows contact 26 being inserted under terminal post 24 for clarity). Each of the four shafts 20 has a circular groove near the top end, a mounting shoulder **20*b*, and is adapted to be rolled over at the bottom end. Each shaft is inserted in a hole in the dielectric material of the printed circuit board 10 so that its shoulder 20*b* rests on the top surface of the board and the shaft is secured to the board by being rolled over upon a washer 28 on the bottom side of the board. The roll over being indicated by the reference character 20*c*. Each of the gears 16 may be a standardized molded plastic piece having a bottom side axial sleeve 16*a*, a top side axial sleeve 16*b* having a vertical slot 16*c* therethrough, five appropriately positioned, internally threaded coil forms 16*d*, and fifteen appropriately positioned holes into which the terminals 24 are press fitted. Each tunable inductor is formed by wrapping a coil of wire 18 about the coil form extension 16*d* of the molded plastic piece and inserting a threaded iron core tuning slug into the center hole of the coil form 16*d***.

The plastic gear 16 is slipped on to the shaft 20 so that the bottom of the sleeve **16*a* bears on the shoulder 20*b*, sleeve 16*a* and shoulder 20*b* providing the requisite spacing between board 10 and gear 16. The gear is held in place by a C-shaped spring clip 30 secured in circular groove 20*a* which allows the gear 16 to freely rotate upon shaft 20**, allowing for expansion of the plastic gear material with ambient temperature changes.

The gear train may be actuated by a pinion gear, drive shaft or some other means coupled to any one of the gears. For example, FIGS. 1 and 2 show a drive shaft 32 attached to the top sleeve **16*b* of the third gear from the left. Rotation of shaft 32 causes the gear to which it is attached to rotate, thereby transmitting a concurrent rotary motion to all the gears of the train. Thus, rotation of the drive shaft is operative to effect simultaneous switching of a selected set of the inductor coils 18** into the four tuned circuit stages on the printed circuit board to accommodate a selected frequency band.

Figure 5:
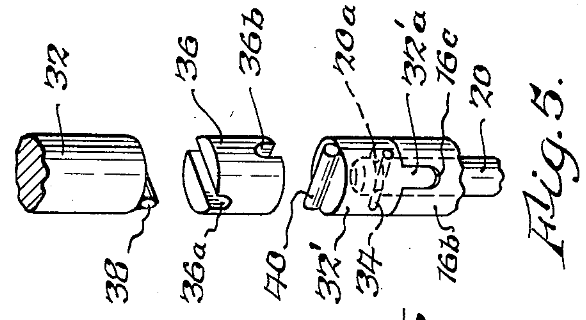

One method of attaching the shaft 32 to the gear is to provide projections **32*a* at the bottom of the shaft which fit into the vertical slots 16*c* in the gear sleeve 16*b* and to pass a pin 34 through shaft 32 which fits into the circular groove 20*a* of shaft 20 to secure the drive shaft thereto. To accommodate this method of drive shaft attachment, of course, sleeve 16*b* of the drive gear must be shorter than the sleeves of the other gears, as illustrated, so as to provide a sufficient spacing between the top of the sleeve and groove 20*a*. Alternatively, if it is desired to standardize the gears, all gears may be adapted for drive shaft attachment, with a washer being inserted between the spring clip 30 and sleeve 16*b* of each of the driven gears. Although this method of drive shaft attachment appears quite simple, it does impose critical alignment requirements. One method of permitting a wider tolerance in shaft alignment is to employ the well known Oldham coupling shown in the exploded perspective view of FIG. 5. The metal drive shaft 32 is essentially severed from its gear attaching portion 32'**, which has a projection 32'a inserted in vertical slots 16c and is attached to shaft 20 by means of pin 34 which passes through piece 32' and the circular groove 20a. Inserted between shaft 32 and section 32' is a cylindrical plastic piece 36 having orthogonal slots 36a and 36b at top and bottom arranged to receive respective projections 38 and 40 from shaft 32 and section 32', respectively. Projections 38 and 40 may comprise, for example, small rods or bars which are brazed to shaft 32 and section 32', respectively. Slot 36b fits snugly on projection 40 and shaft 32 is pressed on to plastic piece 36 such that projection 38 fits snugly into slot 36a. The result is a coupling which permits rotation of the attached gear even with a considerable degree of lateral shaft misalignment.

The parallel plane configuration of the described band switching mechanism with a printed circuit strip of radio frequency stages enables a substantial advance in the compactness and size reduction of tuner packaging. Design is particularly compatible with modern circuit packaging techniques and enhances serviceability, particularly in view of the unidirectional orientation of the tunable inductors. Further, the parallel plane configuration of the coils and components, and the use of the bellows contacts to provide interconnection therebetween provides the requisite short conduction paths to minimize lead inductances and stray capacitance. In contrast to conventional tuners, all circuit components, except the coils can be machined inserted on a single printed circuit board and simultaneously soldered using an endless belt wave soldering machine. Further, the design is compatible with having spiral printed circuit conductors and contacts deposited directly on the molded plastic gears, thus eliminating all hand wiring. Interstage shielding may be easily provided by using metal partitions in the tuner cover which effectively compartmentalize each gear-coil assembly.

Although there has been described what is now considered to be a preferred embodiment of the invention, modifications falling within the scope and spirit of the invention will occur to those skilled in the art. For example, the invention is obviously not limited to the number of coils and tuned stages described, nor to the specific linear gear train configuration illustrated. The tuned circuits or gears can readily be arranged in various ways, yielding square, rectangular, T-, or L-shaped gear train and tuner configurations. The gear train can be mechanically driven from any individual gear either by means of the drive shaft or by a mating gear to permit various drive ratios. The basic mechanical configuration can also be used for high density switching of diode matrices and other components capable of being mounted using printed circuit techniques. Inductors can be etched or deposited, complete with connection traces to gear mounted contacts. Inductors not requiring tuning slugs can be etched on the gear side surfaces. If inductance trimming is required, flat semicircular discs can pivot and rotate parallel with the spiral coil turns, utilizing suitable thin insulating films between the coil and powdered iron parts. The printed circuit board components can also be arranged to be mounted on the same side as the bellows, facing the gear train. Further, other gear arrangements may be employed, such as a friction gear train; resilient contacts other than a bellows may be used; the drive shaft may be arranged to be accessible from the bottom side of the printed circuit board; the drive shaft 32 may be rotatably mounted to the board to support one of the gears 16 without the use of the fixed shaft 20; and, a planar support member other than a printed circuit board may be employed. It is the intention of the applicant, therefore, that the invention is not to be limited to what has been specifically illustrated and described, except as such limitations appear in the appended claims.

What is claimed is:

1. In combination with electrical circuitry mounted on a printed circuit board, a switching mechanism comprising, a coplanar train of gears rotatably mounted on said circuit board with said gear train lying in a plane parallel to and juxtaposed with said circuit board, a plurality of electrical components mounted on each of said gears, a like plurality of sets of switch contacts symmetrically disposed on the side of each gear facing said circuit board, each set of switch contacts being connected to a respective one of the electrical components mounted on that gear, a plurality of sets of bellows contacts disposed on the side of said circuit board facing said train of gears and connected to the electrical circuitry mounted on said circuit board, each set of bellows contacts being associated with a respective one of said gears and arranged in a pattern corresponding with the pattern of each set of switch contacts disposed on that gear whereby rotation of the gear is operative to effect selective engagement between any one of the sets of switch contacts thereon and the set of bellows contacts associated therewith, and means coupled to one of said gears for actuating said gear train.

2. A tuner including, in combination, a printed circuit board upon which a plurality of tuned circuits are mounted and a band switching mechanism comprising, a coplanar train of intermeshing spur gears of dielectric material, means for rotatably mounting said gear train on said printed circuit board with said gear train lying in a plane parallel to and juxtaposed with said printed circuit board, a plurality of inductors mounted on each of said gears, a like plurality of sets of switch contacts disposed symmetrically about the gear axis on the side of each gear facing the printed circuit board, each set of switch contacts being connected to a respective one of the inductors mounted on that gear, a plurality of sets of bellows contacts soldered to appropriate printed circuit traces so as to be disposed on the side of said printed circuit board facing said gear train and connected to the tuned circuits mounted on the printed circuit board, each set of bellows contacts being associated with a respective one of said gears and arranged in a pattern corresponding with the pattern of each set of switch contacts on that gear whereby rotation of the gear is operative to effect selective engagement between any one of the sets of switch contacts thereon and the set of bellows contacts associated therewith, and means coupled to one of said gears for actuating said gear train whereby the concurrent rotation of said gears to a predetermined position is operative to effect simultaneous switching of a selected set of said inductors into said tuned circuits to accommodate a selected frequency band.

References Cited

UNITED STATES PATENTS

| | | | |
|---|---|---|---|
| 2,864,554 | 12/1958 | Rolph et al. | 200—16 X |
| 3,356,972 | 12/1967 | Reith | 334—49 |
| 3,432,760 | 3/1969 | Andzer | 334—49 |

HERMAN KARL SAALBACH, Primary Examiner

P. L. GENSLER, Assistant Examiner

U.S. Cl. X.R.

200—18; 334—56